United States Patent
Cheng et al.

(10) Patent No.: US 9,786,704 B2
(45) Date of Patent: Oct. 10, 2017

(54) CMOS IMAGE SENSOR STRUCTURE WITH CROSSTALK IMPROVEMENT

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Tsung-Han Tsai, Miaoli County (TW); Kuo-Cheng Lee, Tainan (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 21 days.

(21) Appl. No.: 14/850,727

(22) Filed: Sep. 10, 2015

(65) Prior Publication Data
US 2017/0077157 A1 Mar. 16, 2017

(51) Int. Cl.
*H01L 31/0232* (2014.01)
*H01L 27/146* (2006.01)

(52) U.S. Cl.
CPC .... *H01L 27/14621* (2013.01); *H01L 27/1463* (2013.01); *H01L 27/14645* (2013.01); *H01L 27/14685* (2013.01); *H01L 27/1464* (2013.01); *H01L 27/14629* (2013.01); *H01L 27/14689* (2013.01)

(58) Field of Classification Search
CPC ......... H01L 27/14621; H01L 27/14629; H01L 27/1463; H01L 27/1464; H01L 27/14645; H01L 27/14685; H01L 27/14689
See application file for complete search history.

(56) References Cited

U.S. PATENT DOCUMENTS

| | | | | |
|---|---|---|---|---|
| 8,766,386 B2* | 7/2014 | Tsuji | | H01L 27/14621 257/432 |
| 2006/0163451 A1* | 7/2006 | Park | | H01L 27/14621 250/208.1 |
| 2014/0211057 A1* | 7/2014 | Chien | | H04N 5/361 348/308 |
| 2015/0091121 A1* | 4/2015 | Manda | | H01L 27/14621 257/443 |
| 2015/0155322 A1* | 6/2015 | Ting | | H01L 27/14625 257/443 |

* cited by examiner

*Primary Examiner* — Victor A Mandala
*Assistant Examiner* — Colleen E Snow
(74) *Attorney, Agent, or Firm* — Maschoff Brennan

(57) ABSTRACT

A semiconductor device includes a substrate, a device layer, an anti-reflective coating layer, reflective structures, a composite grid structure, a passivation layer and color filters. The device layer is disposed on the substrate, in which trenches are formed in the device layer and the substrate. The anti-reflective coating layer conformally covers the device layer, the substrate and the trenches. The reflective structures are disposed on the anti-reflective coating layer in the trenches respectively. The composite grid structure overlies the anti-reflective coating layer and the reflective structures. The composite grid structure includes cavities passing through the composite grid structure, and the composite grid structure includes a metal grid layer and a dielectric grid layer sequentially stacked on the reflective structures. The passivation layer conformally covers the composite grid structure. The color filters respectively fill the cavities.

20 Claims, 12 Drawing Sheets

CMOS IMAGE SENSOR STRUCTURE WITH CROSSTALK IMPROVEMENT

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Front side illuminated (FSI) CMOS image sensors and back side illuminated (BSI) CMOS image sensors are two types of CMOS image sensors. The FSI CMOS image sensors are operable to detect light projected from their front side while the BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, conventional BSI CMOS image sensors and methods of fabricating the BSI CMOS image sensors have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
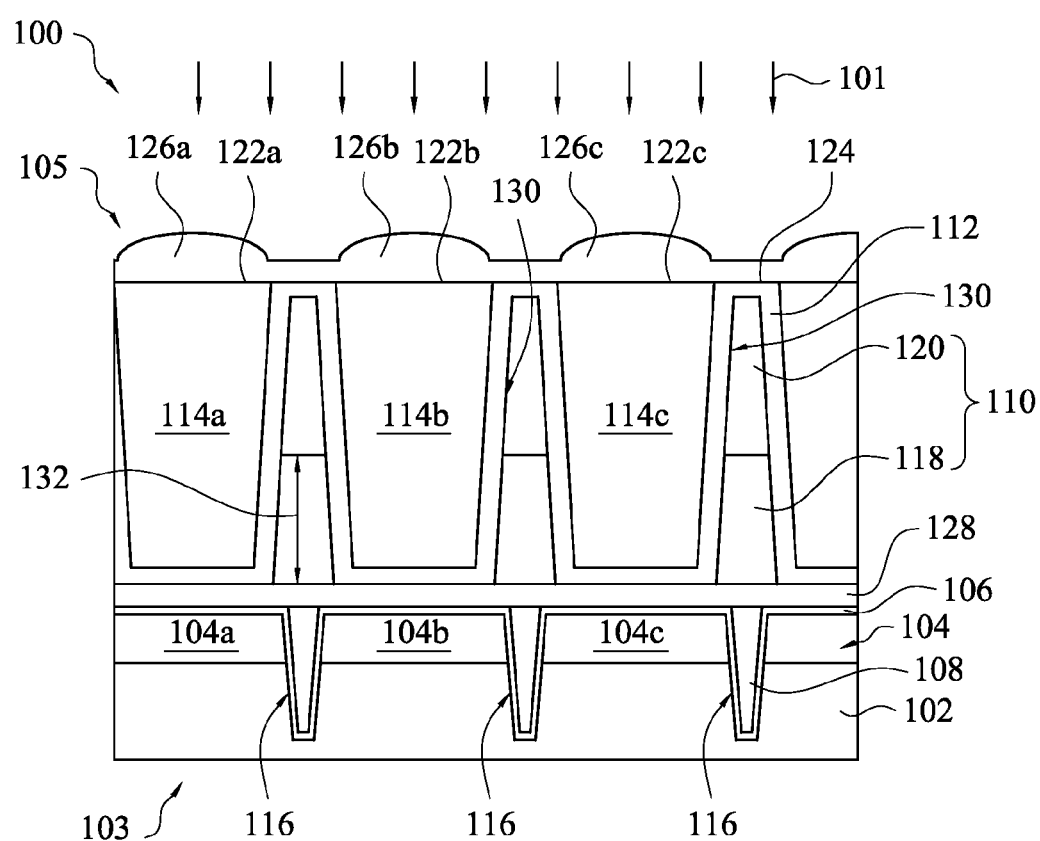
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical BSI CMOS image sensor, a metal grid is disposed on a device layer, and a passivation layer is needed to cover the metal grid for separating the metal grid from color filters, so as to prevent the color filters from corroding the metal grid. Then, the color filters are disposed on a flat top surface of the passivation layer side by side. However, any two adjacent color filters overlap with each other, thus causing crosstalk. In addition, the existence of the passivation layer increases the thickness of the BSI CMOS image sensor and an optical path of the BSI CMOS image sensor, and the passivation layer does not have light confinement ability and forms an optical crosstalk path, thus further worsening optical crosstalk of the BSI CMOS image sensor. A buried color filter array (BCFA) structure is introduced to reduce the optical path of the BSI CMOS image sensor. However, the color filters cover the passivation layer and the metal grid, and protruding portions of the color filters are arranged side by side, thus causing crosstalk.

Embodiments of the present disclosure are directed to providing a semiconductor device and a method for manufacturing the semiconductor device, in which various reflective structures extend from a device layer to a substrate underlying the device layer; a dielectric grid layer is directly disposed on a metal grid layer to form a composite grid structure on the reflective structures; a passivation layer conformally covers the composite grid structure; and color filters fill cavities of the composite grid structure, such that the color filters are located closer to a device layer than color filters of a conventional BSI CMOS image sensor, thereby reducing optical paths from the color filters to the device layer and enhancing quantum efficiency of the semiconductor device. Furthermore, because there is no additional layer disposed between the metal grid layer and the dielectric grid layer, and the reflective structures pass through the device layer, light is effectively blocked from diffusing to adjacent photoelectric devices by the composite grid structure and the reflective structures, thereby enhancing imaging performance of the semiconductor device.

In addition, the dielectric grid layer and the metal grid layer can be formed by using one single etching process, and thus a process window can be enlarged. Moreover, top surfaces of the color filters are elevated at the same level with a top of the passivation layer, such that the color filters do not overlap with one another, thereby further reducing a crosstalk effect of the semiconductor device and enhancing the performance of the semiconductor device. The dielectric grid layer is adjustable for different color filter materials because the color filters fully fill the cavities of the composite grid structure.

FIG. 1 is schematic cross-sectional view of a semiconductor device in accordance with various embodiments. In some embodiments, a semiconductor device 100 is a CMOS image sensor device, which may be operated for sensing incident light 101. The semiconductor device 100 has a front side 103 and a back side 105. In some examples, the semiconductor device 100 is a BSI CMOS image sensor device, which is operated to sense the incident light 101 projected from its back side 105.

As shown in FIG. 1, the semiconductor device 100 includes a substrate 102, a device layer 104, an anti-reflective coating layer 106, various reflective structures 108, a composite grid structure 110, a passivation layer 112 and various color filters such as color filters 114a, 114b and 114c. The substrate 102 is a semiconductor substrate, and may be composed of a single-crystalline semiconductor material or a compound semiconductor material. For example, silicon, germanium or glass may be used as a material of the substrate 102.

The device layer 104 is disposed on the substrate 102. In some examples, a material of the device layer 104 includes silicon. For example, the material of the device layer 104 may include epitaxial silicon. Referring to FIG. 1 again, various trenches 116 are formed in the device layer 104 and the substrate 102. Each of the trenches 116 extends from a top of the device layer 104 to the substrate 102. In some examples, each of the trenches 116 is a deep trench. The trenches 116 divide the device layer 104 into various photoelectric devices 104a, 104b and 104c, in which the trenches 116 separate the photoelectric devices 104a, 104b and 104c from each other. In some examples, the photoelectric devices 104a, 104b and 104c are photodiodes.

As shown in FIG. 1, the anti-reflective coating layer 106 conformally covers the device layer 104, the substrate 102 and the trenches 116. The anti-reflective coating layer 106 is configured to prevent the light from diffusing to the adjacent photoelectric devices 104a, 104b and 104c. For example, the anti-reflective coating layer 106 may be formed from silicon oxide.

The reflective structures 108 are disposed on the anti-reflective coating layer 106 and fill the trenches 116 respectively. The reflective structures 108 may be formed from metal or dielectric material. In some exemplary examples, the reflective structures 108 are formed from the dielectric material, and each of the reflective structures 108 is a deep trench isolation (DTI) structure. For example, each of the reflective structures 108 may have a height ranging from about 0.1 micrometer to about 2.5 micrometer.

In some examples, as shown in FIG. 1, the semiconductor device 100 may optionally include a buffer layer 128. The buffer layer 128 is disposed on the anti-reflective coating layer 106 and the reflective structures 108, and is located between the anti-reflective coating layer 106 and the composite grid structure 110. The buffer layer 128 is suitable for use in increasing the adhesion between the composite grid structure 110 and the anti-reflective coating layer 106. For example, the buffer layer 128 may be formed form a dielectric layer, such as silicon dioxide.

The composite grid structure 110 is disposed on the buffer layer 128, and overlies the anti-reflective coating layer 106 and the reflective structures 108. As shown in FIG. 1, the composite grid structure 110 covers the reflective structures 108 correspondingly. The composite grid structure 110 includes various cavities 130 which are formed in the composite grid structure 110 and pass through the composite grid structure 110, such that the cavities 130 may expose portions of the buffer layer 128. In some examples, each cavity 130 has a cross section in a shape of trapezoid. In certain examples, each cavity 130 has a cross section in a shape of rectangle. The cavities 130 may be periodically arranged. A pitch between the cavities 130, a depth, a length and a width of each cavity 130 may be modified according to requirements of the semiconductor device 100.

In some examples, the composite grid structure 110 includes a metal grid layer 118 and a dielectric grid layer 120. The metal grid layer 118 is disposed on the buffer layer 128, and the dielectric grid layer 120 is stacked on the metal grid layer 118. The metal grid layer 118 and the dielectric grid layer 120 are stacked on the reflective structures 108 sequentially. As shown in FIG. 1, the metal grid layer 118 is separated from the reflective structures 108 by the buffer layer 128. The cavities 130 sequentially pass through the dielectric grid layer 120 and the metal grid layer 118. In some examples, the metal grid layer 118 is formed from metal or a metal alloy, such as tungsten or an aluminum-copper alloy. The metal grid layer 118 and the reflective structures 108 may be formed from the same material, or may be formed form different materials. For example, the metal grid layer 118 may have a thickness 132 ranging from about 500 angstrom to about 5000 angstrom. In some examples, the dielectric grid layer 120 is formed from silicon oxide, silicon nitride or silicon oxynitride.

Referring to FIG. 1 again, the passivation layer 112 conformally covers the composite grid structure 110, such that the passivation layer 112 covers the portions of the buffer layer 128 exposed by the cavities 130. The passivation layer 112 is suitable for use in protecting the composite grid structure 110 from being corroded by the color filters 114a, 114b and 114c. In some examples, the passivation layer 112 is formed from silicon oxide, silicon nitride or silicon oxynitride.

The color filters 114a, 114b and 114c are disposed on the passivation layer 112 and respectively fill the cavities 130 of the composite grid structure 110. The color filters 114a, 114b and 114c may be arranged sequentially. In some exemplary examples, the color filters 114a, 114b and 114c includes red color filters, blue color filters and green color filters. In some examples, as shown in FIG. 1, top surfaces 122a, 122b and 122c of the color filters 114a, 114b and 114c are elevated at the same level with a top 124 of the passivation layer 112.

In some examples, as shown in FIG. 1, the semiconductor device 100 may optionally include various micro lenses 126a, 126b and 126c. The micro lenses 126a, 126b and 126c respectively cover the top surfaces 122a, 122b and 122c of the color filters 114a, 114b and 114c.

The dielectric grid layer 120 is directly disposed on the metal grid layer 118 to form the composite grid structure 110, and the color filters 114a, 114b and 114c fill the cavities 130 of the composite grid structure 110, such that the color filters 114a, 114b and 114c are located closer to the device layer 104 than color filters of a conventional semiconductor device, thereby resulting in shorter optical paths from the color filters 114a, 114b and 114c to the device layer 104 underlying the cavities 130, thus enhancing quantum efficiency of the semiconductor device 100. Furthermore, there is no additional layer disposed between the metal grid layer 118 and the dielectric grid layer 120, and the reflective structures 108 pass through the device layer 104, such that light is effectively blocked from diffusing to adjacent photoelectric devices 104a, 104b and 104c by the composite grid structure 110 and the reflective structures 108, thereby enhancing imaging performance of the semiconductor device 100. Moreover, the top surfaces 122a, 122b and 122c of the color filters 114a, 114b and 114c are elevated at the same level with the top 124 of the passivation layer 112, such that the color filters 114a, 114b and 114c can be effectively separated from each other by the composite grid structure 110 and the passivation layer 112, and the color filters 114a, 114b and 114c do not overlap with one another, thereby further reducing a crosstalk effect of the semiconductor device 100 and enhancing the performance of the semiconductor device 100.

Figure 2:
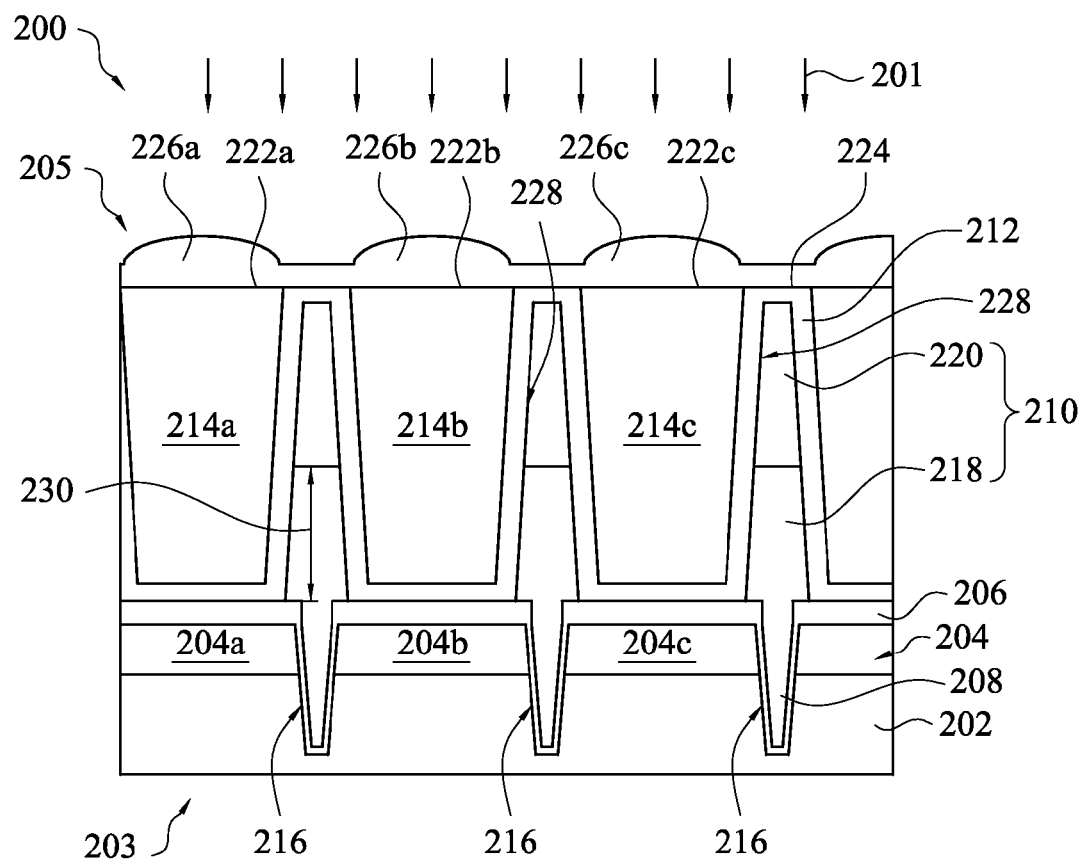
FIG. 2 is a schematic cross-sectional view of a semiconductor device in accordance with various embodiments.

FIG. 2 is schematic cross-sectional view of a semiconductor device in accordance with various embodiments. In some embodiments, a semiconductor device 200 is a CMOS image sensor device, which may be operated for sensing incident light 201. The semiconductor device 200 has a front side 203 and a back side 205. In some examples, the semiconductor device 200 is a BSI CMOS image sensor device, which is operated to sense the incident light 201 projected from its back side 205.

As shown in FIG. 2, the semiconductor device 200 includes a substrate 202, a device layer 204, an anti-reflective coating layer 206, various reflective structures 208, a composite grid structure 210, a passivation layer 212 and various color filters such as color filters 214a, 214b and 214c. The substrate 202 is a semiconductor substrate, and may be composed of a single-crystalline semiconductor material or a compound semiconductor material. For example, silicon, germanium or glass may be used as a material of the substrate 202.

The device layer 204 is disposed on the substrate 202. In some examples, a material of the device layer 204 includes silicon, such as epitaxial silicon. Referring to FIG. 2 again, various trenches 216 are formed in the device layer 204 and the substrate 202. Each of the trenches 216 extends from a top of the device layer 204 to the substrate 202. In some examples, each of the trenches 216 is a deep trench. The trenches 216 divide the device layer 204 into various photoelectric devices 204a, 204b and 204c, in which the trenches 216 separate the photoelectric devices 204a, 204b and 204c from each other. In some examples, the photoelectric devices 204a, 204b and 204c are photodiodes.

As shown in FIG. 2, the anti-reflective coating layer 206 conformally covers the device layer 204, the substrate 202 and the trenches 216. The anti-reflective coating layer 106 is configured to prevent the light from diffusing to the adjacent photoelectric devices 204a, 204b and 204c. For example, the anti-reflective coating layer 206 may be formed from silicon oxide.

The reflective structures 208 are disposed on the anti-reflective coating layer 206 and fill the trenches 216 respectively. The reflective structures 208 may be formed from metal or dielectric material. In some exemplary examples, the reflective structures 208 are formed from the dielectric material, and each of the reflective structures 208 is a deep trench isolation structure. For example, each of the reflective structures 208 may have a height ranging from about 0.1 micrometer to about 2.5 micrometer.

The composite grid structure 210 is disposed on the anti-reflective coating layer 206 and the reflective structures 208. As shown in FIG. 2, the composite grid structure 210 covers the reflective structures 208 correspondingly. The composite grid structure 210 includes various cavities 228 which are formed in the composite grid structure 210 and pass through the composite grid structure 210, such that the cavities 228 may expose portions of the anti-reflective coating layer 206. In some examples, each cavity 228 has a cross section in a shape of trapezoid. In certain examples, each cavity 228 has a cross section in a shape of rectangle. The cavities 228 may be periodically arranged. A pitch between the cavities 228, a depth, a length and a width of each cavity 130 may be modified according to requirements of the semiconductor device 200.

In some examples, the composite grid structure 210 includes a metal grid layer 218 and a dielectric grid layer 220. The metal grid layer 218 is disposed on the anti-reflective coating layer 206 and the reflective structures 208. In some exemplary examples, the metal grid layer 218 and the reflective structures 208 are formed simultaneously and are integrated, such that the metal grid layer 218 directly contacts with the reflective structures 208. The metal grid layer 218 and the reflective structures 208 are formed from the same material. The dielectric grid layer 220 is stacked on the metal grid layer 218. The cavities 228 sequentially pass through the dielectric grid layer 220 and the metal grid layer 218. In some examples, the metal grid layer 218 and the reflective structures 208 are formed from metal or a metal alloy, such as tungsten or an aluminum-copper alloy. For example, the metal grid layer 218 may have a thickness 230 ranging from about 500 angstrom to about 5000 angstrom. In some examples, the dielectric grid layer 220 is formed from silicon oxide, silicon nitride or silicon oxynitride.

Referring to FIG. 2 again, the passivation layer 212 conformally covers the composite grid structure 210, such that the passivation layer 212 covers the portions of the anti-reflective coating layer 206 exposed by the cavities 228. The passivation layer 212 is suitable for use in protecting the composite grid structure 210 from being corroded by the color filters 214a, 214b and 214c. In some examples, the passivation layer 212 is formed from silicon oxide, silicon nitride or silicon oxynitride.

The color filters 214a, 214b and 214c are disposed on the passivation layer 212 and respectively fill the cavities 228 of the composite grid structure 210. The color filters 214a, 214b and 214c may be arranged sequentially. In some exemplary examples, the color filters 214a, 214b and 214c includes red color filters, blue color filters and green color filters. In some examples, as shown in FIG. 2, top surfaces 222a, 222b and 222c of the color filters 214a, 214b and 214c are elevated at the same level with a top 224 of the passivation layer 212.

In some examples, as shown in FIG. 2, the semiconductor device 200 may optionally include various micro lenses 226a, 226b and 226c. The micro lenses 226a, 226b and 226c respectively cover the top surfaces 222a, 222b and 222c of the color filters 214a, 214b and 214c.

The dielectric grid layer 220 is directly disposed on the metal grid layer 218 to form the composite grid structure 210, and the color filters 214a, 214b and 214c fill the cavities 228 of the composite grid structure 210, such that the color filters 214a, 214b and 214c are located closer to the device layer 204 than color filters of a conventional semiconductor device, thereby resulting in shorter optical paths from the color filters 214a, 214b and 214c to the device layer 204 underlying the cavities 228, thus enhancing quantum efficiency of the semiconductor device 200. In addition, the dielectric grid layer 220 directly stacks on the metal grid layer 218, and the reflective structures 208 pass through the device layer 204, such that light is effectively blocked from diffusing to adjacent photoelectric devices 204a, 204b and 204c by the composite grid structure 210 and the reflective structures 208, thereby enhancing imaging performance of the semiconductor device 200. Moreover, the top surfaces 222a, 222b and 222c of the color filters 214a, 214b and 214c are elevated at the same level with the top 224 of the passivation layer 212, such that the color filters 214a, 214b and 214c can be effectively separated from each other by the composite grid structure 210 and the passivation layer 212, and the color filters 214a, 214b and 214c do not overlap with one another, thereby further reducing a crosstalk effect of the semiconductor device 200 and enhancing the performance of the semiconductor device 200.

Figure 3A:
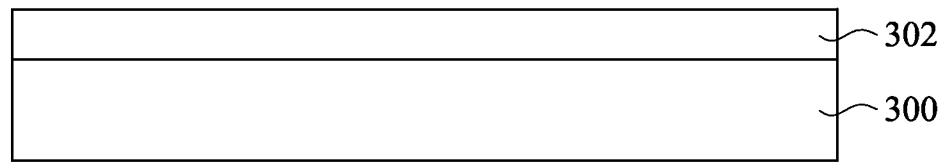
FIG. 3A through FIG. 3J are schematic cross-sectional views of intermediate stages showing a method for manufacturing a semiconductor device in accordance with various embodiments.

FIG. 3A through FIG. 3J are schematic cross-sectional views of intermediate stages showing a method for manufacturing a semiconductor device in accordance with various embodiments. As shown in FIG. 3A, a substrate 300 is provided. The substrate 300 is a semiconductor substrate, and may be composed of a single-crystalline semiconductor material or a compound semiconductor material. For example, silicon, germanium or glass may be used as a material of the substrate 300.

Referring to FIG. 3A again, a device layer 302 is formed on the substrate 300 by using, for example, a deposition technique, an epitaxial technique or a bonding technique. In some examples, the operation of forming the device layer 302 includes forming the device layer 302 from silicon. For example, the device layer 302 may be formed from epitaxial silicon.

Figure 3B:
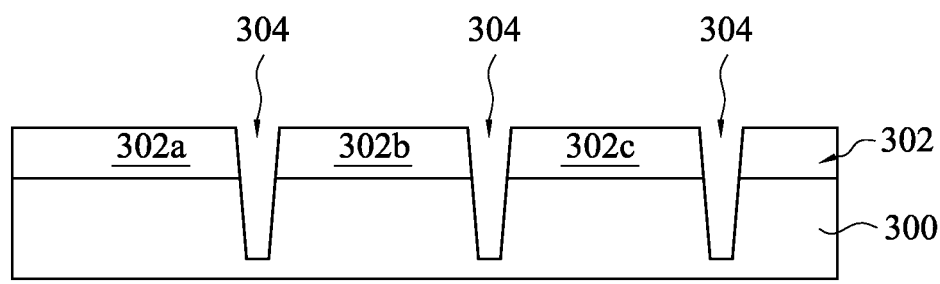

As shown in FIG. 3B, various trenches 304 are formed in the device layer 302 and the substrate 300. In some examples, the operation of forming the trenches 304 is performed to form various deep trenches. The operation of forming the trenches 304 includes removing a portion of the device layer 302 and a portion of the substrate 300 which underlies the portion of the device layer 302, such that each of the trenches 304 extends from the device layer 302 to the substrate 300. In some exemplary examples, the operation of forming the trenches 304 is performed by using a photolithograph process and an etching process. For example, the etching process may be a dry etching process or a wet etching process. After the operation of forming the trenches 304, the device layer 302 is divided into various photoelectric devices 302a, 302b and 302c, in which the trenches 304 separate the photoelectric devices 302a, 302b and 302c from each other. In some examples, the photoelectric devices 302a, 302b and 302c are photo diodes.

Figure 3C:
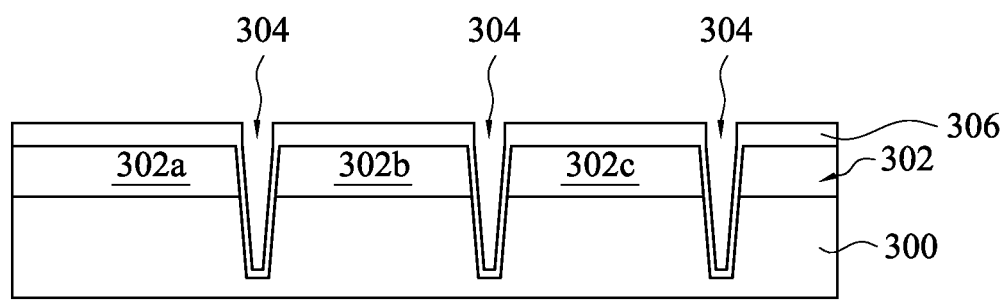

As shown in FIG. 3C, an anti-reflective coating layer 306 is formed to conformally cover the device layer 302, the substrate 300 and the trenches 304. The anti-reflective coating layer 306 is formed to cover the photoelectric devices 302a, 302b and 302c. The operation of forming the anti-reflective coating layer 306 may be performed by using a deposition technique, such as a chemical vapor deposition (CVD) technique. The anti-reflective coating layer 306 may be formed from silicon oxide.

Figure 3D:
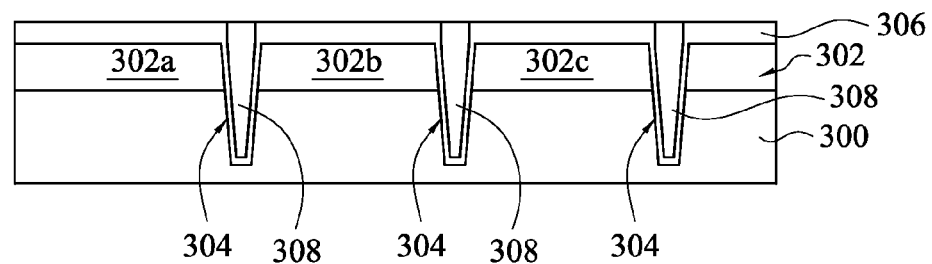

As shown in FIG. 3D, various reflective structures 308 are formed on the anti-reflective coating layer 306 in the trenches 304 by using a deposition technique, such as a chemical vapor deposition technique, a physical vapor deposition (PVD) technique or a plasma-enhanced chemical vapor deposition (PECVD) technique. The operation of forming the reflective structures 308 includes forming the reflective structures 308 filling the trenches 304 respectively. The reflective structures 308 may be formed from metal or dielectric material. In some exemplary examples, the reflective structures 308 are formed from the dielectric material, and each of the reflective structures 308 is formed to be a deep trench isolation structure. For example, each of the reflective structures 308 may be formed to have a height ranging from about 0.1 micrometer to about 2.5 micrometer.

Figure 3E:
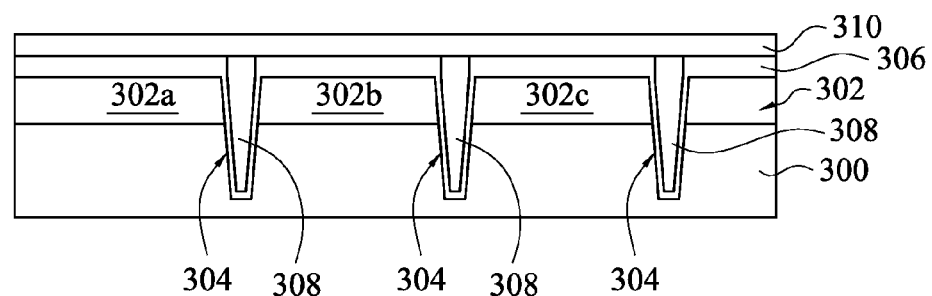

In some examples, as shown in FIG. 3E, a buffer layer 310 may be optionally formed on and covering the anti-reflective coating layer 306 and the reflective structures 308. The operation of forming the buffer layer 310 may be performed by using a deposition technique, such as a chemical vapor deposition technique. For example, the buffer layer 310 may be formed form a dielectric layer, such as silicon dioxide.

Figure 3F:
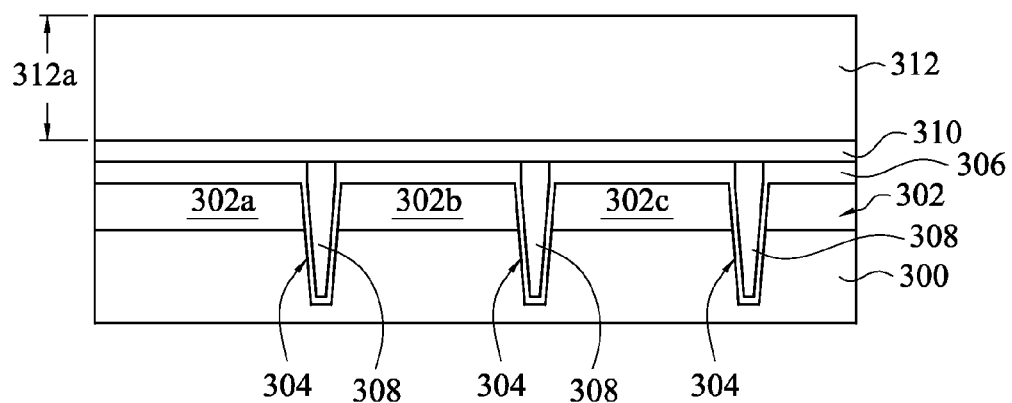
Figure 3G:
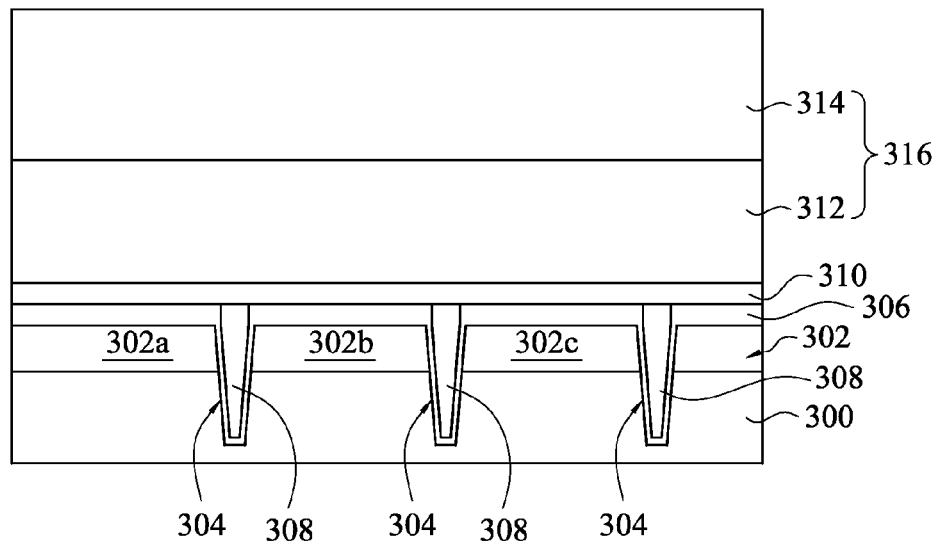

Referring to FIG. 3F and FIG. 3G simultaneously, a composite structure 316 is formed on the buffer layer 310 over the anti-reflective coating layer 306 and the reflective structures 308. In some examples, the operation of forming the composite structure 316 includes forming a metal layer 312 to cover the buffer layer 310 over the anti-reflective coating layer 306 and the reflective structures 308, as shown in FIG. 3F. The metal layer 312 is formed from metal or metal alloy, such as tungsten or aluminum-copper alloy. The metal layer 312 and the reflective structures 308 may be formed from the same material, or may be formed form different materials. In addition, the operation of forming the reflective structures 308 and the operation of forming the metal layer 312 are performed by using different deposition processes. The metal layer 312 may be formed by using, for example, a chemical vapor deposition technique or a physical vapor deposition technique. In some exemplary examples, the metal layer 312 is formed to have a thickness 312a ranging from about 500 angstrom to about 5000 angstrom. The operation of forming the composite structure 316 further includes forming a dielectric layer 314 stacked on the metal layer 312, as shown in FIG. 3G. The dielectric layer 314 may be formed from silicon oxide, silicon nitride or silicon oxynitride, for example. The dielectric layer 314 may be formed by using, for example, a chemical vapor deposition technique.

Figure 3H:
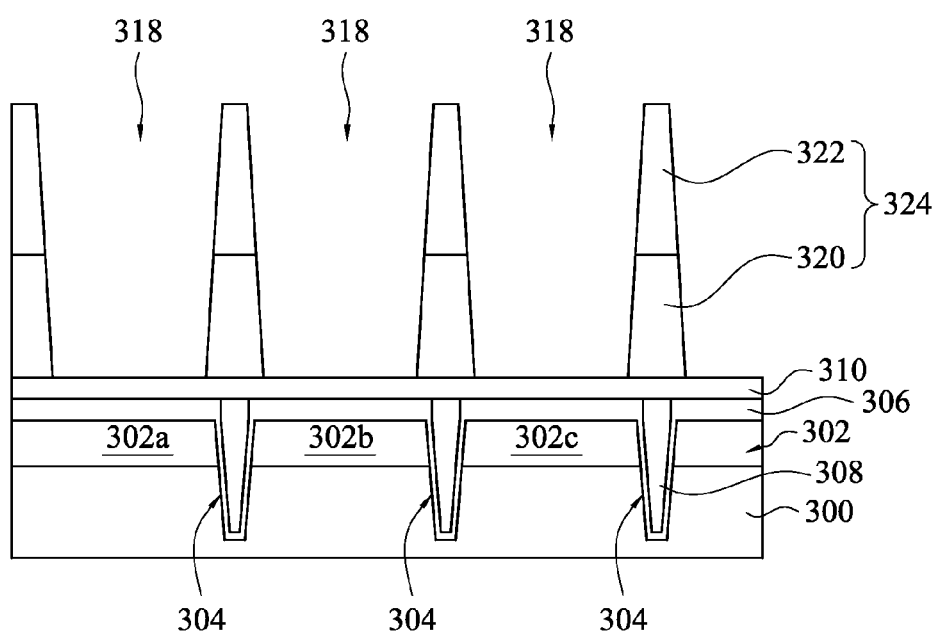

Referring to FIG. 3G and FIG. 3H simultaneously, various cavities 318 are formed in the composite structure 316, so as to complete a composite grid structure 324. For example, the operation of forming the cavities 318 may be performed by using a photolithography process and an etching process. The operation of forming the cavities 318 includes removing a portion of the dielectric layer 314 and a portion of the metal layer 312 of the composite structure 316, to respectively form a dielectric grid layer 322 and a metal grid layer 320 and to expose portions of the buffer layer 310. The cavities 318 pass through the composite structure 316, and correspondingly expose the portions of the buffer layer 310 overlying the photoelectric devices 302a, 302b and 302c. The dielectric grid layer 322 is formed to stack on the metal grid layer 320 to form the composite grid structure 324, in which the composite grid structure 324 is formed to cover the trenches 304 and the reflective structures 308. In some examples, as shown in FIG. 3H, each cavity 318 is formed to have a cross section in a shape of trapezoid. In certain examples, each cavity 318 is formed to have a cross section in a shape of rectangle. The cavities 318 may be periodically arranged.

In some exemplary examples, the operation of removing the portion of the dielectric layer 314 and the portion of the metal layer 312 is performed by using one single etching process, such that a process window can be enlarged. In certain examples, the operation of removing the portion of the dielectric layer 314 and the portion of the metal layer 312 is performed by using different etching processes, and the dielectric grid layer 322 can be used as an etching hard mask in the operation of etching the portion of the metal layer 312.

Figure 3I:
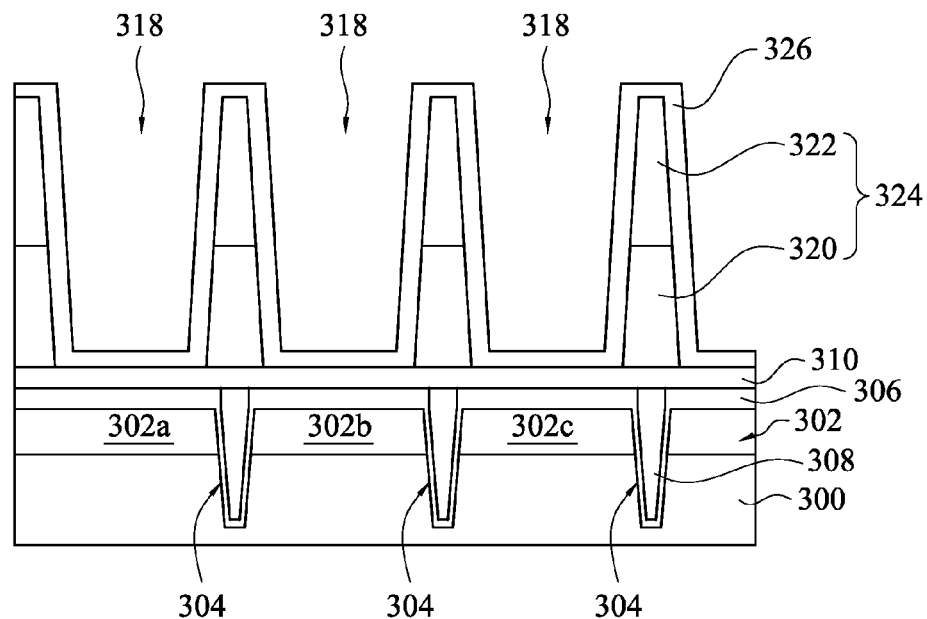

As shown in FIG. 3I, a passivation layer 326 is formed to conformally cover the composite grid structure 324, such that the passivation layer 326 covers the portions of the buffer layer 310 exposed by the cavities 318. The operation of forming the passivation layer 326 may be performed by using, for example, a chemical vapor deposition technique or a physical vapor deposition technique. In some examples, the passivation layer 326 is formed from silicon oxide, silicon nitride or silicon oxynitride.

Figure 3J:
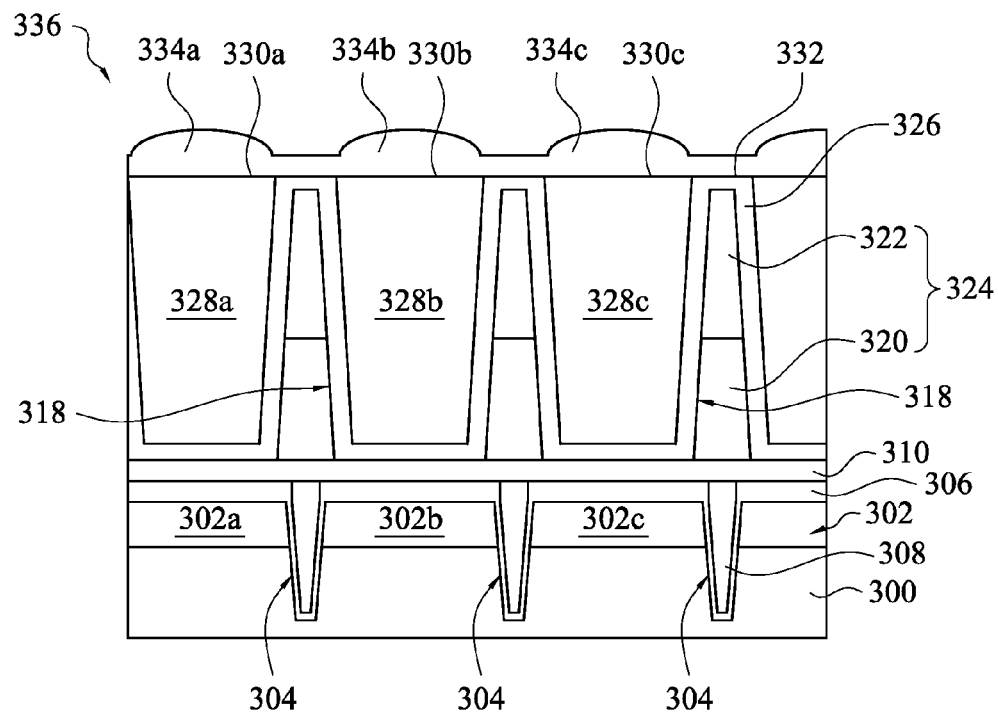

As shown in FIG. 3J, various color filters 328a, 328b and 328c are formed on the passivation layer 326 and respectively filling the cavities 318. The color filters 328a, 328b and 328c may be arranged sequentially. In some exemplary examples, the color filters 328a, 328b and 328c are formed to include red color filters, blue color filters and green color filters. In some examples, the operation of forming the color filters 328a, 328b and 328c is performed to form the color filters 328a, 328b and 328c respectively having top surfaces 330a, 330b and 330c, in which the top surfaces 330a, 330b and 330c are elevated at the same level with a top 332 of the passivation layer 326. The color filters 328a, 328b and 328c are formed in the cavities 318, such that a thickness of the dielectric grid layer 322 is tunable according to height requirements of the color filters 328a, 328b and 328c.

Referring to FIG. 3J again, various micro lenses 334a, 334b and 334c may be optionally formed to cover the top surfaces 330a, 330b and 330c of the color filters 328a, 328b and 328c respectively, so as to complete a semiconductor device 336.

Figure 4:
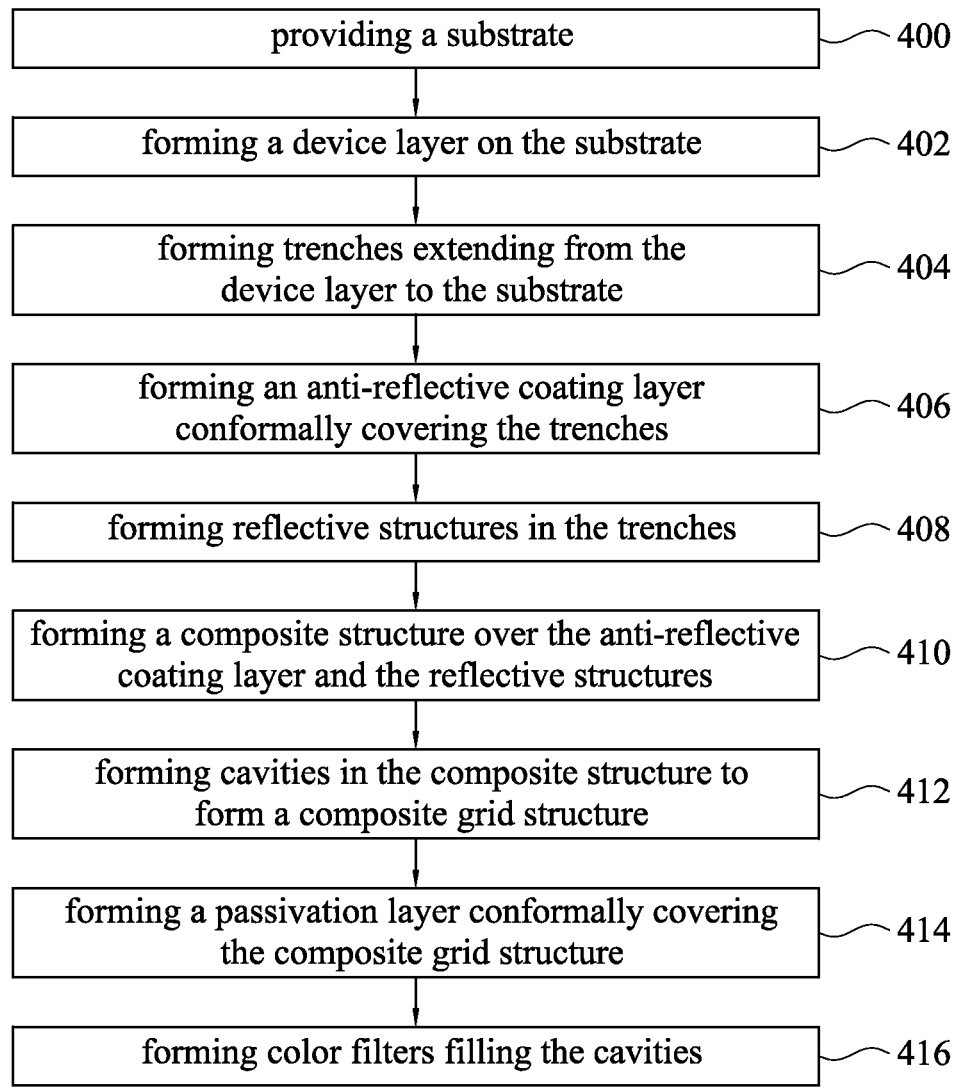
FIG. 4 is a flow chart of a method for manufacturing a semiconductor device in accordance with various embodiments.

Referring to FIG. 4 with FIG. 3A through FIG. 3J, FIG. 4 is a flow chart of a method for manufacturing a semiconductor device in accordance with various embodiments. The method begins at operation 400, where a substrate 300 is provided. At operation 402, a device layer 302 is formed on the substrate 300, as shown in FIG. 3A. The operation of forming the device layer 302 may be performed using, for example, a deposition technique, an epitaxial technique or a bonding technique.

At operation 404, as shown in FIG. 3B, various trenches 304 are formed in the device layer 302 and the substrate 300 by using a photolithograph process and an etching process. For example, the etching process may be a dry etching process or a wet etching process. In some examples, the operation of forming the trenches 304 is performed to form various deep trenches. The operation of forming the trenches 304 includes removing a portion of the device layer 302 and a portion of the substrate 300 which underlies the portion of the device layer 302, such that each of the trenches 304 extends from the device layer 302 to the substrate 300. After the operation of forming the trenches 304, the device layer 302 is divided into various photoelectric devices 302a, 302b and 302c, in which the trenches 304 separate the photoelectric devices 302a, 302b and 302c from each other.

At operation 406, as shown in FIG. 3C, an anti-reflective coating layer 306 is formed to conformally cover the device layer 302, the substrate 300 and the trenches 304 by using a deposition technique, such as a chemical vapor deposition technique. The anti-reflective coating layer 306 is formed to cover the photoelectric devices 302a, 302b and 302c.

At operation 408, as shown in FIG. 3D, various reflective structures 308 are formed on the anti-reflective coating layer 306 in the trenches 304 by using a deposition technique, such as a chemical vapor deposition technique, a physical vapor deposition technique or a plasma-enhanced chemical vapor deposition technique. The operation of forming the reflective structures 308 includes forming the reflective structures 308 filling the trenches 304 respectively. In some exemplary examples, each of the reflective structures 308 is formed to be a deep trench isolation structure. For example, each of the reflective structures 308 may be formed to have a height ranging from about 0.1 micrometer to about 2.5 micrometer. As shown in FIG. 3E, a buffer layer 310 may be optionally formed on and covering the anti-reflective coating layer 306 and the reflective structures 308 by using a deposition technique, such as a chemical vapor deposition technique.

At operation 410, referring to FIG. 3F and FIG. 3G simultaneously, a composite structure 316 is formed on the buffer layer 310 over the anti-reflective coating layer 306 and the reflective structures 308. In some examples, the operation of forming the composite structure 316 includes forming a metal layer 312 to cover the buffer layer 310 over the anti-reflective coating layer 306 and the reflective structures 308, as shown in FIG. 3F. The metal layer 312 may be formed by using, for example, a chemical vapor deposition technique or a physical vapor deposition technique. In some exemplary examples, the metal layer 312 is formed to have a thickness 312a ranging from about 500 angstrom to about 5000 angstrom. As shown in FIG. 3G, the operation of forming the composite structure 316 further includes forming a dielectric layer 314 stacked on the metal layer 312 by using, for example, a chemical vapor deposition technique.

At operation 412, referring to FIG. 3G and FIG. 3H simultaneously, various cavities 318 are formed in the composite structure 316 by using a photolithography process and an etching process, so as to complete a composite grid structure 324. The operation of forming the cavities 318 includes removing a portion of the dielectric layer 314 and a portion of the metal layer 312 of the composite structure 316 to respectively form a dielectric grid layer 322 and a metal grid layer 320 and to expose portions of the buffer layer 310. The cavities 318 correspondingly expose the portions of the buffer layer 310 overlying the photoelectric devices 302a, 302b and 302c. The dielectric grid layer 322 is formed to stack on the metal grid layer 320 to form the composite grid structure 324, in which the composite grid structure 324 is formed to cover the trenches 304 and the reflective structures 308.

In some exemplary examples, the operation of removing the portion of the dielectric layer 314 and the portion of the metal layer 312 is performed by using one single etching process. In certain examples, the operation of removing the portion of the dielectric layer 314 and the portion of the metal layer 312 is performed by using different etching processes, and the dielectric grid layer 322 can be used as an etching hard mask in the operation of etching the portion of the metal layer 312.

At operation 414, as shown in FIG. 3I, a passivation layer 326 is formed to conformally cover the composite grid structure 324, such that the passivation layer 326 is formed to cover the portions of the buffer layer 310 exposed by the cavities 318. The operation of forming the passivation layer 326 may be performed by using, for example, a chemical vapor deposition technique or a physical vapor deposition technique.

At operation 416, as shown in FIG. 3J, various color filters 328a, 328b and 328c are formed on the passivation layer 326 and respectively filling the cavities 318. In some exemplary examples, the color filters 328a, 328b and 328c are formed to include red color filters, blue color filters and green color filters. In some examples, the operation of forming the color filters 328a, 328b and 328c is performed to form the color filters 328a, 328b and 328c respectively having top surfaces 330a, 330b and 330c, in which the top surfaces 330a, 330b and 330c are elevated at the same level with a top 332 of the passivation layer 326. Referring to FIG. 3J again, various micro lenses 334a, 334b and 334c may be optionally formed to cover the top surfaces 330a, 330b and 330c of the color filters 328a, 328b and 328c respectively, so as to complete a semiconductor device 336.

Figure 5A:
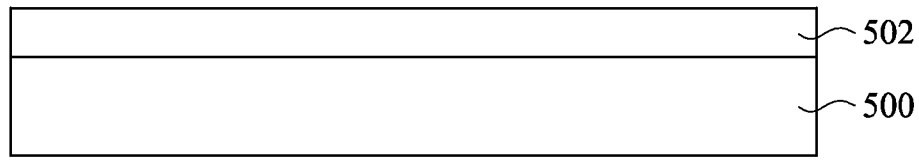
FIG. 5A through FIG. 5H are schematic cross-sectional views of intermediate stages showing a method for manufacturing a semiconductor device in accordance with various embodiments.

FIG. 5A through FIG. 5H are schematic cross-sectional views of intermediate stages showing a method for manufacturing a semiconductor device in accordance with various embodiments. As shown in FIG. 5A, a substrate 500 is provided. The substrate 500 is a semiconductor substrate, and may be composed of a single-crystalline semiconductor material or a compound semiconductor material. For example, silicon, germanium or glass may be used as a material of the substrate 500.

Referring to FIG. 5A again, a device layer 502 is formed on the substrate 500 by using, for example, a deposition technique, an epitaxial technique or a bonding technique. In some examples, the operation of forming the device layer 502 includes forming the device layer 502 from silicon. For example, the device layer 502 may be formed from epitaxial silicon.

Figure 5B:
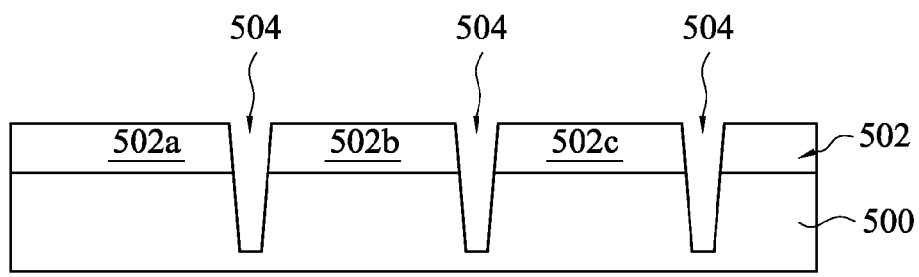

As shown in FIG. 5B, various trenches 504 are formed in the device layer 502 and the substrate 500. In some examples, the operation of forming the trenches 504 is performed to form various deep trenches. The operation of forming the trenches 504 includes removing a portion of the device layer 502 and a portion of the substrate 500 which underlies the portion of the device layer 502, such that each of the trenches 504 extends from the device layer 502 to the substrate 500. In some exemplary examples, the operation of forming the trenches 504 is performed by using a photolithograph process and an etching process. For example, the etching process may be a dry etching process or a wet etching process. After the operation of forming the trenches 504, the device layer 502 is divided into various photoelectric devices 502a, 502b and 502c, in which the trenches 504 separate the photoelectric devices 502a, 502b and 502c from each other. In some examples, the photoelectric devices 502a, 502b and 502c are photo diodes.

Figure 5C:
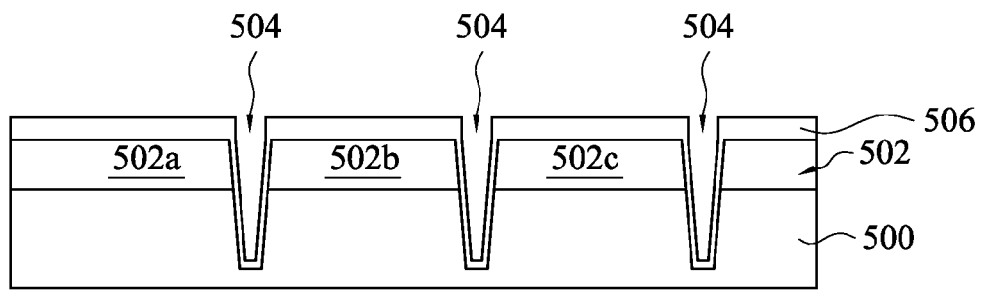

As shown in FIG. 5C, an anti-reflective coating layer 506 is formed to conformally cover the device layer 502, the substrate 500 and the trenches 504. The anti-reflective coating layer 506 is formed to cover the photoelectric devices 502a, 502b and 502c. The operation of forming the anti-reflective coating layer 506 may be performed by using a deposition technique, such as a chemical vapor deposition technique. The anti-reflective coating layer 506 may be formed from silicon oxide.

Figure 5D:
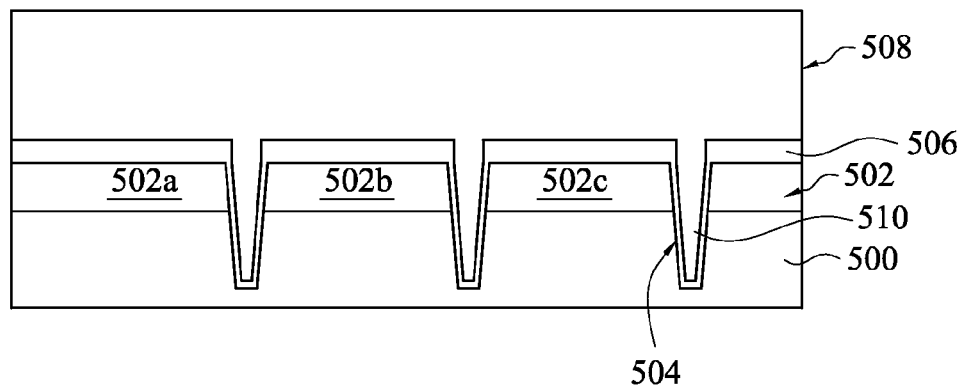
Figure 5E:
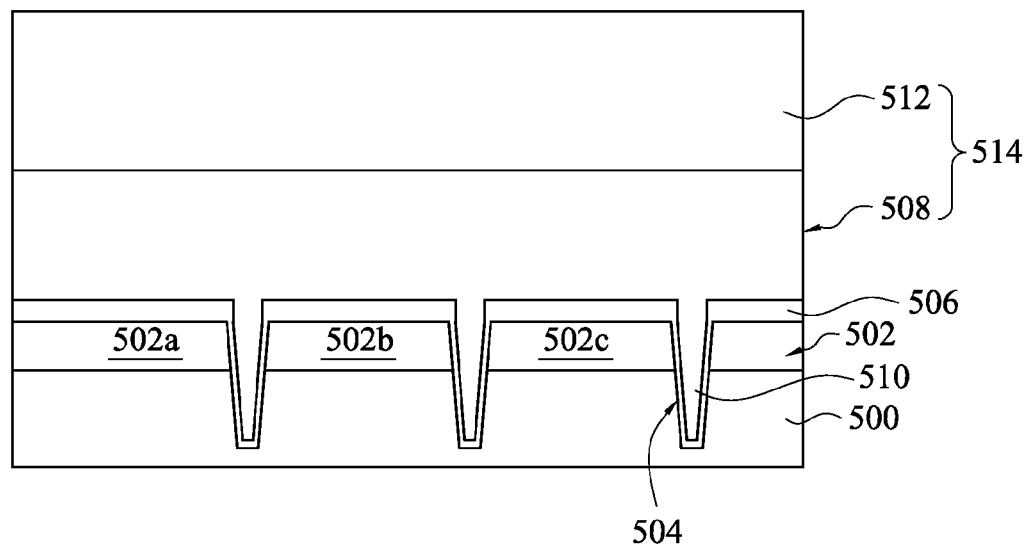

Referring to FIG. 5D and FIG. 5E simultaneously, a composite structure 514 is formed on the anti-reflective coating layer 506. In some examples, the operation of forming the composite structure 514 includes forming a metal layer 508 to cover the anti-reflective coating layer 506, as shown in FIG. 5D. A portion of the metal layer 508 fills the trenches 504 to form various reflective structures 510 respectively in the trenches 504. The metal layer 508 is formed from metal or metal alloy, such as tungsten or aluminum-copper alloy. The metal layer 508 may be formed by using, for example, a chemical vapor deposition technique or a physical vapor deposition technique. As shown in FIG. 5E, the operation of forming the composite structure 514 further includes forming a dielectric layer 512 stacked on the metal layer 508. The dielectric layer 512 may be formed from silicon oxide, silicon nitride or silicon oxynitride, for example. The dielectric layer 512 may be formed by using, for example, a chemical vapor deposition technique.

Figure 5F:
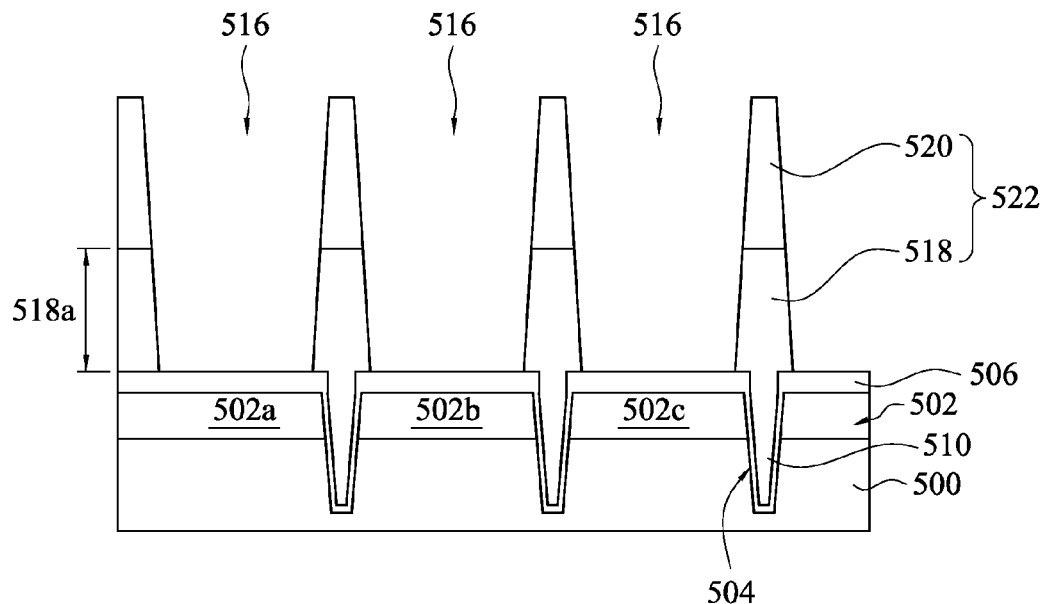

Referring to FIG. 5E and FIG. 5F simultaneously, various cavities 516 are formed in the composite structure 514, so as to complete a composite grid structure 522. For example, the operation of forming the cavities 516 may be performed by using a photolithography process and an etching process. The operation of forming the cavities 516 includes removing a portion of the dielectric layer 512 and a portion of the metal layer 508 of the composite structure 514, to respectively form a dielectric grid layer 520 and a metal grid layer 518 and to expose portions of the anti-reflective coating layer 506. For example, the metal grid layer 518 is formed to have a thickness 518a ranging from about 500 angstrom to about 5000 angstrom. The cavities 516 pass through the composite structure 514, and correspondingly expose the portions of the anti-reflective coating layer 506 overlying the photoelectric devices 502a, 502b and 502c. The dielectric grid layer 520 is formed to stack on the metal grid layer 518 to form the composite grid structure 522, in which the composite grid structure 522 is formed to cover the trenches 504 and the reflective structures 510. In some examples, as shown in FIG. 5F, each cavity 516 is formed to have a cross section in a shape of trapezoid. In certain examples, each cavity 516 is formed to have a cross section in a shape of rectangle. The cavities 516 may be periodically arranged.

In the examples, the reflective structures 510 are the portion of the metal layer 508 filling the trenches 504, while the metal grid layer 518 is the other portion of the metal layer 508 on the reflective structures 510 and a portion of the anti-reflective coating layer 506. Thus, the reflective structures 510 and the metal grid layer 518 are formed from the same material, and the operation of forming the reflective structures 510 and the operation of forming the metal grid layer 518 are performed by using the same deposition processes, such that the process of forming the reflective structures 510 and the metal grid layer 518 is simplified.

In some exemplary examples, the operation of removing the portion of the dielectric layer 512 and the portion of the metal layer 508 is performed by using one single etching process, such that a process window can be enlarged. In certain examples, referring to FIGS. 5E and 5F again, the operation of removing the portion of the dielectric layer 512 and the portion of the metal layer 508 is performed by using different etching processes, and the dielectric grid layer 520 can be used as an etching hard mask in the operation of etching the portion of the metal layer 508.

Figure 5G:
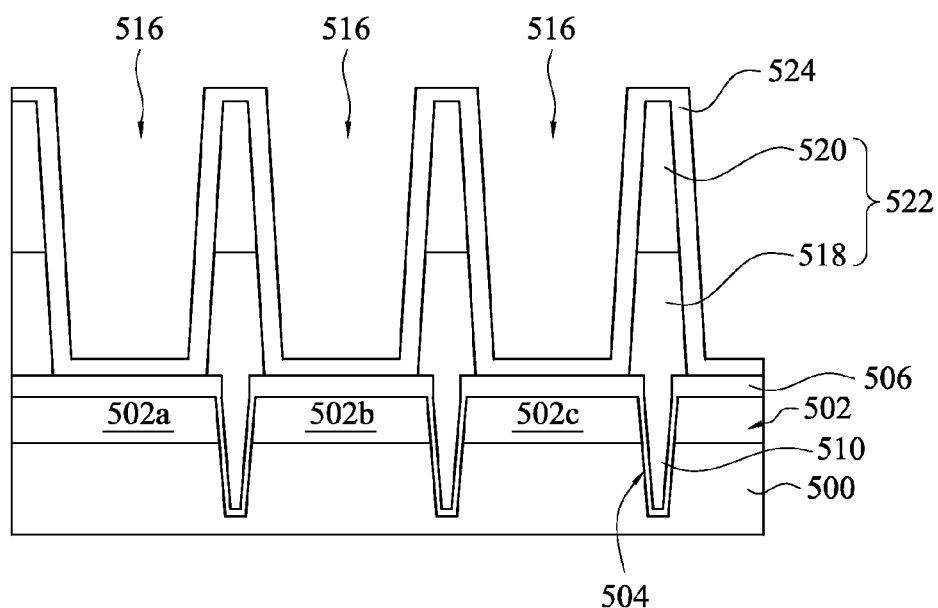

As shown in FIG. 5G, a passivation layer 524 is formed to conformally cover the composite grid structure 522, such that the passivation layer 524 covers the portions of the anti-reflective coating layer 506 exposed by the cavities 516. The operation of forming the passivation layer 524 may be performed by using, for example, a chemical vapor deposition technique or a physical vapor deposition technique. In some examples, the passivation layer 524 is formed from silicon oxide, silicon nitride or silicon oxynitride.

Figure 5H:
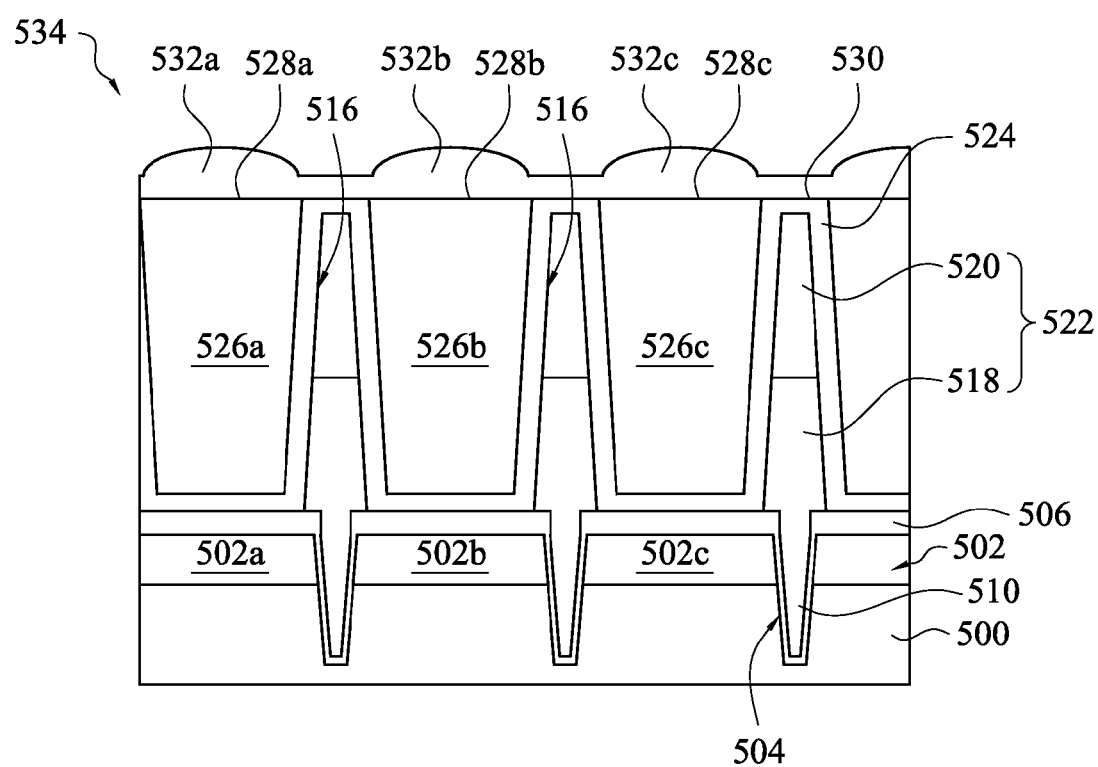

As shown in FIG. 5H, various color filters 526a, 526b and 526c are formed on the passivation layer 524 and respectively filling the cavities 516. The color filters 526a, 526b and 526c may be arranged sequentially. In some exemplary examples, the color filters 526a, 526b and 526c are formed to include red color filters, blue color filters and green color filters. In some examples, the operation of forming the color filters 526a, 526b and 526c is performed to form the color filters 526a, 526b and 526c respectively having top surfaces 528a, 528b and 528c, in which the top surfaces 528a, 528b and 528c are elevated at the same level with a top 530 of the passivation layer 524. The color filters 526a, 526b and 526c are formed in the cavities 516, such that a thickness of the dielectric grid layer 520 is tunable according to height requirements of the color filters 526a, 526b and 526c.

Referring to FIG. 5H again, various micro lenses 532a, 532b and 532c may be optionally formed to cover the top surfaces 528a, 528b and 528c of the color filters 526a, 526b and 526c respectively, so as to complete a semiconductor device 534.

Figure 6:
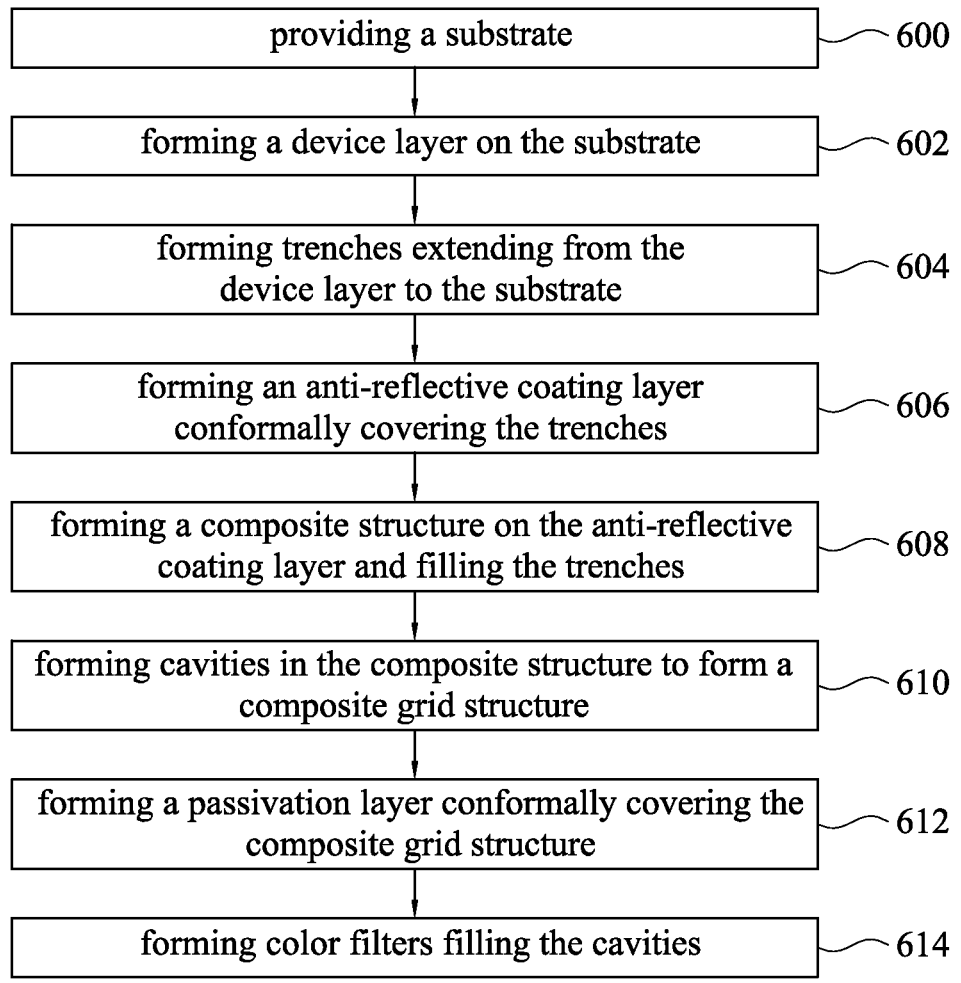
FIG. 6 is a flow chart of a method for manufacturing a semiconductor device in accordance with various embodiments.

Referring to FIG. 6 with FIG. 5A through FIG. 5H, FIG. 6 is a flow chart of a method for manufacturing a semiconductor device in accordance with various embodiments. The method begins at operation 600, where a substrate 500 is provided. At operation 602, a device layer 502 is formed on the substrate 500, as shown in FIG. 5A. The operation of forming the device layer 502 may be performed using, for example, a deposition technique, an epitaxial technique or a bonding technique.

At operation 604, as shown in FIG. 5B, various trenches 504 are formed in the device layer 502 and the substrate 500 by using a photolithograph process and an etching process. For example, the etching process may be a dry etching process or a wet etching process. In some examples, the operation of forming the trenches 504 is performed to form various deep trenches. The operation of forming the trenches 504 includes removing a portion of the device layer 502 and a portion of the substrate 500 which underlies the portion of the device layer 502, such that each of the trenches 504 extends from the device layer 502 to the substrate 500. After the operation of forming the trenches 504, the device layer 502 is divided into various photoelectric devices 502a, 502b and 502c, in which the trenches 504 separate the photoelectric devices 502a, 502b and 502c from each other.

At operation 606, as shown in FIG. 5C, an anti-reflective coating layer 506 is formed to conformally cover the device layer 502, the substrate 500 and the trenches 504 by using a deposition technique, such as a chemical vapor deposition technique. The anti-reflective coating layer 506 is formed to cover the photoelectric devices 502a, 502b and 502c.

At operation 608, referring to FIG. 5D and FIG. 5E simultaneously, a composite structure 514 is formed on the anti-reflective coating layer 506. In some examples, as shown in FIG. 5D, the operation of forming the composite structure 514 includes forming a metal layer 508 to cover the anti-reflective coating layer 506 by using, for example, a chemical vapor deposition technique or a physical vapor deposition technique. A portion of the metal layer 508 fills the trenches 504 to form various reflective structures 510 respectively in the trenches 504. As shown in FIG. 5E, the operation of forming the composite structure 514 further includes forming a dielectric layer 512 stacked on the metal layer 508 by using, for example, a chemical vapor deposition technique.

At operation 610, referring to FIG. 5E and FIG. 5F simultaneously, various cavities 516 are formed in the composite structure 514 by using a photolithography process and an etching process, so as to complete a composite grid structure 522. The operation of forming the cavities 516 includes removing a portion of the dielectric layer 512 and a portion of the metal layer 508 of the composite structure 514, to respectively form a dielectric grid layer 520 and a metal grid layer 518 and to expose portions of the anti-reflective coating layer 506. For example, the metal grid layer 518 is formed to have a thickness 518a ranging from about 500 angstrom to about 5000 angstrom. The cavities 516 pass through the composite structure 514, and correspondingly expose the portions of the anti-reflective coating layer 506 overlying the photoelectric devices 502a, 502b and 502c. The dielectric grid layer 520 is formed to stack on the metal grid layer 518 to form the composite grid structure 522, in which the composite grid structure 522 is formed to cover the trenches 504 and the reflective structures 510.

In the examples, the reflective structures 510 are the portion of the metal layer 508 filling the trenches 504, while the metal grid layer 518 is the other portion of the metal layer 508 on the reflective structures 510 and a portion of the anti-reflective coating layer 506. Thus, the reflective structures 510 and the metal grid layer 518 are formed from the same material, and the operation of forming the reflective structures 510 and the operation of forming the metal grid layer 518 are performed by using the same deposition processes.

In some exemplary examples, the operation of removing the portion of the dielectric layer 512 and the portion of the metal layer 508 is performed by using one single etching process. In certain examples, referring to FIGS. 5E and 5F again, the operation of removing the portion of the dielectric layer 512 and the portion of the metal layer 508 is performed by using different etching processes, and the dielectric grid layer 520 can be used as an etching hard mask in the operation of etching the portion of the metal layer 508.

At operation 612, as shown in FIG. 5G, a passivation layer 524 is formed to conformally cover the composite grid structure 522, such that the passivation layer 524 covers the portions of the anti-reflective coating layer 506 exposed by the cavities 516. The operation of forming the passivation layer 524 may be performed by using a chemical vapor deposition technique or a physical vapor deposition technique.

At operation 614, as shown in FIG. 5H, various color filters 526a, 526b and 526c are formed on the passivation layer 524 and respectively filling the cavities 516. In some exemplary examples, the color filters 526a, 526b and 526c are formed to include red color filters, blue color filters and green color filters. In some examples, the operation of forming the color filters 526a, 526b and 526c is performed to form the color filters 526a, 526b and 526c respectively having top surfaces 528a, 528b and 528c, in which the top surfaces 528a, 528b and 528c are elevated at the same level with a top 530 of the passivation layer 524. Referring to FIG. 5H again, various micro lenses 532a, 532b and 532c may be optionally formed to cover the top surfaces 528a, 528b and 528c of the color filters 526a, 526b and 526c respectively, so as to complete a semiconductor device 534.

In accordance with an embodiment, the present disclosure discloses a semiconductor device. The semiconductor device includes a substrate, a device layer, an anti-reflective coating layer, reflective structures, a composite grid structure, a passivation layer and color filters. The device layer is disposed on the substrate, in which trenches are formed in the device layer and the substrate. The anti-reflective coating layer conformally covers the device layer, the substrate and the trenches. The reflective structures are disposed on the anti-reflective coating layer in the trenches respectively. The composite grid structure overlies the anti-reflective coating layer and the reflective structures. The composite grid structure includes cavities passing through the composite grid structure, and the composite grid structure includes a metal grid layer and a dielectric grid layer sequentially stacked on the reflective structures. The passivation layer conformally covers the composite grid structure. The color filters respectively fill the cavities.

In accordance with another embodiment, the present disclosure discloses a method for manufacturing a semiconductor device. In this method, a substrate is provided. A device layer is formed on the substrate. Trenches are formed to extend from the device layer to the substrate. An anti-reflective coating layer is formed to conformally cover the device layer, the substrate and the trenches. Reflective structures are formed on the anti-reflective coating layer in the trenches respectively. A composite structure is formed over the anti-reflective coating layer and the reflective structures. The operation of forming the composite structure is performed to sequentially form a metal layer and a dielectric layer stacked on the anti-reflective coating layer and the reflective structures. Cavities are formed in the composite structure and to pass through the composite structure, so as to form a composite grid structure. Color filters are formed to respectively fill the cavities.

In accordance with yet another embodiment, the present disclosure discloses a method for manufacturing a semiconductor device. In this method, a substrate is provided. A device layer is formed on the substrate. Trenches are formed to extend from the device layer to the substrate. An anti-reflective coating layer is formed to conformally cover the device layer, the substrate and the trenches. A composite structure is formed on the anti-reflective coating layer. The operation of forming the composite structure includes forming a metal layer filling the trenches and disposed on the anti-reflective coating layer, and forming a dielectric layer stacked on the metal layer. Cavities are formed in the composite structure and to pass through the composite structure, so as to form a composite grid structure. The operation of forming the composite grid structure is performed to form the composite grid structure covering the trenches. A passivation layer is formed to conformally cover the composite grid structure. Color filters are formed to respectively fill the cavities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a substrate;
a device layer disposed on the substrate, wherein a plurality of trenches are formed in the device layer and the substrate, and the trenches divide the device layer into a plurality of photoelectric devices;
an anti-reflective coating layer conformally covering the device layer, the substrate, and the trenches;
a plurality of reflective structures disposed on the anti-reflective coating layer in the trenches respectively, wherein the reflective structures separate the photoelectric devices from each other, and the reflective structures are formed from metal;
a composite grid structure overlying the anti-reflective coating layer and the reflective structures, wherein the composite grid structure comprises a plurality of cavities passing through the composite grid structure, and the composite grid structure comprises a metal grid layer and a dielectric grid layer sequentially stacked on the reflective structures;
a passivation layer conformally covering the composite grid structure; and
a plurality of color filters respectively filling the cavities.

2. The semiconductor device of claim 1, wherein each of the reflective structures is a deep trench isolation structure.

3. The semiconductor device of claim 2, wherein each of the reflective structures has a height ranging from 0.1 micrometer to 2.5 micrometer.

4. The semiconductor device of claim 1, wherein the metal grid layer is formed from tungsten or an aluminum-copper alloy.

5. The semiconductor device of claim 1, wherein the metal grid layer and the reflective structures are formed from the same material.

6. The semiconductor device of claim 1, wherein the metal grid layer directly contacts with the reflective structures.

7. The semiconductor device of claim 1, further comprising a buffer layer disposed on the anti-reflective coating layer and the reflective structures, and between the anti-reflective coating layer and the metal grid layer.

8. The semiconductor device of claim 1, further comprising a plurality of micro lenses respectively covering top surfaces of the color filters.

9. The semiconductor device of claim 1, wherein top surfaces of the color filters are elevated at the same level with a top of the passivation layer.

10. A method for manufacturing a semiconductor device, the method comprising:
providing a substrate;
forming a device layer on the substrate;
forming a plurality of trenches extending from the device layer to the substrate to divide the device layer into a plurality of photoelectric devices;
forming an anti-reflective coating layer conformally covering the device layer, the substrate, and the trenches;
forming a plurality of reflective structures on the anti-reflective coating layer in the trenches respectively, wherein the reflective structures separate the photoelectric devices from each other, and the reflective structures are formed from metal;
forming a composite structure over the anti-reflective coating layer and the reflective structures, wherein the forming the composite structure is performed to sequentially form a metal layer and a dielectric layer stacked on the anti-reflective coating layer and the reflective structures;
forming a plurality of cavities in the composite structure and passing through the composite structure, so as to form a composite grid structure;
forming a passivation layer conformally covering the composite grid structure; and
forming a plurality of color filters respectively filling the cavities.

11. The method of claim 10, wherein between the forming the reflective structures and the forming the composite structure, the method further comprising forming a buffer layer on the anti-reflective coating layer and the reflective structures.

12. The method of claim 10, wherein the forming the cavities comprises removing a portion of the dielectric layer and a portion of the metal layer by using one single etching process.

13. The method of claim 10, wherein after the forming the color filters, the method further comprising forming a plurality of micro lenses respectively covering top surfaces of the color filters, wherein the top surfaces of the color filters are elevated at the same level with a top of the passivation layer.

14. The method of claim 10, wherein the forming the reflective structures and the forming the metal layer are performed by using different deposition processes.

15. The method of claim 10, wherein the color filters are formed to have top surfaces which are elevated at the same level with a top of the passivation layer.

16. A method for manufacturing a semiconductor device, the method comprising:
providing a substrate;
forming a device layer on the substrate;
forming a plurality of trenches extending from the device layer to the substrate;
forming an anti-reflective coating layer conformally covering the device layer, the substrate, and the trenches;
forming a composite structure on the anti-reflective coating layer, wherein the forming the composite structure comprises forming a metal layer filling the trenches and disposed on the anti-reflective coating layer, and forming a dielectric layer stacked on the metal layer;
forming a plurality of cavities in the composite structure and passing through the composite structure, so as to form a composite grid structure, wherein the forming the composite grid structure is performed to form the composite grid structure covering the trenches;
forming a passivation layer conformally covering the composite grid structure; and
forming a plurality of color filters respectively filling the cavities.

17. The method of claim 16, wherein the forming the cavities comprises removing a portion of the dielectric layer and a portion of the metal layer by using one single etching process.

18. The method of claim 16, wherein the forming the cavities comprises exposing a portion of the anti-reflective coating layer.

19. The method of claim 16, wherein the forming the color filters is performed to form the color filters having top surfaces which are elevated at the same level with a top of the passivation layer.

20. The method of claim 16, wherein after the forming the color filters, the method further comprising forming a plurality of micro lenses respectively covering top surfaces of the color filters.

* * * * *